(12) United States Patent
Bouche et al.

(10) Patent No.: US 9,406,775 B1
(45) Date of Patent: Aug. 2, 2016

(54) METHOD FOR CREATING SELF-ALIGNED COMPACT CONTACTS IN AN IC DEVICE MEETING FABRICATION SPACING CONSTRAINTS

(71) Applicant: GLOBALFOUNDRIES Inc., Grand Cayman (KY)

(72) Inventors: Guillaume Bouche, Albany, NY (US); Andy Wei, Queensbury, NY (US); Youngtag Woo, San Ramon, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/696,684

(22) Filed: Apr. 27, 2015

(51) Int. Cl.
| H01L 21/76 | (2006.01) |
| H01L 29/66 | (2006.01) |
| H01L 29/78 | (2006.01) |
| H01L 23/535 | (2006.01) |
| H01L 27/11 | (2006.01) |
| H01L 21/768 | (2006.01) |

(52) U.S. Cl.
CPC ...... *H01L 29/66515* (2013.01); *H01L 21/7684* (2013.01); *H01L 21/76805* (2013.01); *H01L 21/76897* (2013.01); *H01L 23/535* (2013.01); *H01L 27/11* (2013.01); *H01L 29/66545* (2013.01); *H01L 29/66795* (2013.01); *H01L 29/7851* (2013.01)

(58) Field of Classification Search
CPC ............... H01L 21/302; H01L 21/20; H01L 21/823437
USPC ........................................................ 438/586
See application file for complete search history.

(56) References Cited

U.S. PATENT DOCUMENTS 6,451,708 B1 * 9/2002 Ha ..................... H01L 21/31116
257/E21.252

\* cited by examiner

*Primary Examiner* — Tran Tran
(74) *Attorney, Agent, or Firm* — Ditthavong & Steiner, P.C.

(57) ABSTRACT

Methods for forming a self-aligned gate-cut in close proximity to a gate contact and the resulting device are disclosed. Embodiments include providing a substrate with silicon fins and a metal gate with a nitride-cap perpendicular to and over the fins, with source/drain regions, each with an oxide-cap, on the fins on opposite sides of the gate; forming parallel dielectric lines, separated from each other, perpendicular to and over the gate; forming a photoresist over the parallel dielectric lines, forming an opening in the photoresist exposing a nitride-cap between two fins; removing the exposed nitride-cap exposing an underlying metal gate; removing the exposed metal gate and a remainder of the photoresist; forming low-k dielectric lines between the parallel dielectric lines; removing sections of the parallel dielectric lines; forming perpendicular interconnects between the low-k dielectric lines; removing a remainder of the parallel dielectric lines forming trenches; and filling the trenches with metal.

15 Claims, 19 Drawing Sheets

BACKGROUND

BACKGROUND

BACKGROUND

METHOD FOR CREATING SELF-ALIGNED COMPACT CONTACTS IN AN IC DEVICE MEETING FABRICATION SPACING CONSTRAINTS

TECHNICAL FIELD

The present disclosure relates generally to designing and fabricating integrated circuit (IC) devices. The present disclosure is particularly applicable to creating self-aligned compact contacts associated with a memory cell (e.g., static random access memory (SRAM)) in an IC device, particularly for 10 nanometer (nm) technology nodes and beyond.

BACKGROUND

Generally, an IC device may include various components and elements such as memory cells, processor cores, analog circuits, or the like. Additionally, an IC device may include contacts and vias for interconnecting the components, which may be in close proximity at a same or different layer in the IC device. For example, a transistor may include a gate contact that may be connected by a via to a metal layer above the gate contact. There are different processes and methods that are utilized by the semiconductor industry to manufacture/fabricate an IC device. With advances in these methods/processes and industry demands for more efficient and smaller sized IC devices, physical dimensions of the components and elements integrated into the IC devices are continuously reduced. Also, spaces separating the components/elements/contacts from each other are also reduced, which can give rise to various challenges in the manufacturing of such IC devices. For example, photolithography processes may be utilized to pattern various shapes onto a surface of a silicon (Si) substrate for creating the components in an IC device. However, smaller geometries and highly dense components designed into an IC device can adversely impact device reliability, manufacturing yields, cost, manufacturing times, and the like processes that are associated with an IC device. Additionally, some components (e.g., a processor) in an IC device may be created by use of a certain fabrication process (e.g., smaller node size) that may be incompatible with processes that may be used to create other components (e.g., a memory cell requiring larger spacing) or elements in the same IC device.

FIGS. 1A and 1B are three-dimensional diagrams of structures in an example IC device. FIG. 1A illustrates a Si substrate 101 and included structures 103 and Si fins 105 that may be constructed by use of a fin-type fabrication process. Details of an example section 107 are shown in FIG. 1B, which illustrates source/drain S/D (or D/S) regions 109 and 111, each including a S/D contact 113 (e.g., of Tungsten) and a silicon oxide-cap 115. Additionally illustrated is a metal gate 117 with a nitride-cap 119 and dielectric spacers 121 (e.g., carbon-doped silicon-oxide, SiOC), on opposite sides of each metal gate 117 and nitride-cap 119, that separate the metal gate 117 and its nitride-cap 119 from adjacent S/D regions 109 and 111 and their oxide-caps 115.

FIG. 1C illustrates a layout diagram including a gate contact and adjacent gate cut in an example IC device. The diagram includes metal gate structures 117 where at least one gate structure, 117a, is connected to a metal line 123 (e.g., above the gate) with a gate contact 125. Additionally, the metal gate structure 117a includes a gate-cut 127 that is in close proximity to the gate contact 125. The layout illustrated in FIG. 1C may be associated with a SRAM component that is to be implemented, along with other components and elements, in an IC device. As noted, with reduced/shrinking geometries used in design and fabrication of IC devices, it can be challenging to continue to reduce spacing 129 between the gate contact 125 and the gate cut 127 while meeting fabrication constraints for fabricating such a component.

A need therefore exists for a methodology to create reliable gate contacts in close proximity to gate cuts in an IC device and the resulting device.

SUMMARY

An aspect of the present disclosure is an IC device that includes a self-aligned gate cut in close proximity to a contact to gate.

Another aspect of the present disclosure is a method for implementing a self-aligned gate cut in close proximity to a contact to gate in an IC device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a substrate with silicon fins and at least one metal gate with a nitride-cap perpendicular to and over the silicon fins, with source/drain (S/D) regions on the fins on opposite sides of each gate and an oxide-cap on each S/D region; forming parallel dielectric lines separated from each other perpendicular to and over the at least one gate; forming a first photoresist over the parallel dielectric lines and forming an opening in the photoresist to expose a nitride-cap between two fins; removing the exposed nitride-cap to expose an underlying metal gate; removing the exposed metal gate and a remainder of the first photoresist layer; forming low-k dielectric lines adjacent to and in between the parallel dielectric lines; removing sections of the parallel dielectric lines; forming perpendicular interconnects between the parallel low-k dielectric lines; removing a remainder of the parallel dielectric lines forming trenches; and forming a metal layer in the trenches.

Another aspect includes forming a second photoresist layer on the parallel low-k dielectric lines and the perpendicular interconnects and in the trenches prior to forming the metal layer; removing sections of the second photoresist layer to expose oxide-caps; and removing the exposed oxide-caps and a remainder of the second photoresist layer.

One aspect includes forming a third photoresist layer on the parallel low-k dielectric lines and the perpendicular interconnects and in the trenches; removing sections of the third photoresist layer to expose nitride-caps; removing the exposed nitride-caps to form nitride-cap cavities, wherein each of the nitride-cap cavities is adjacent to a gate cavity; and removing a remainder of the third photoresist layer.

In some aspects, forming of the metal layer includes forming the metal layer on the parallel low-k dielectric lines and the perpendicular interconnects and in the trenches; and performing a chemical mechanical polishing of the metal layer to be substantially coplanar with an upper surface of the low-k dielectric lines.

Other aspects include forming each of the parallel dielectric lines by forming an amorphous Si layer on the upper surface of the Si substrate and a silicon-nitride (SiN) layer on upper surface of the amorphous Si layer. In one aspect, each of the S/D regions is recessed and includes a metal contact. One aspect includes forming a silicon dioxide layer on the SiN layer of the parallel dielectric lines. In another aspect the SiN layer is thicker than the nitride-cap.

Another aspect includes forming dielectric spacers on opposite sides of each metal gate, separating the metal gate and nitride-cap from adjacent S/D regions and oxide-caps, respectively.

Another aspect of the present disclosure includes a device including: a Si substrate including Si fins; at least one metal gate with S/D regions on the fins on opposite sides of each metal gate; a gate cut, including a low-k dielectric material, in the at least one metal gate in between two adjacent fins; and a metal gate contact adjacent to the gate cut.

In one aspect, the device includes coplanar alternating parallel metal lines and low-k dielectric lines on an upper surface of Si substrate.

In some aspects, the device includes perpendicular interconnects between the parallel low-k dielectric lines. In one aspect of the device, each of the S/D regions is recessed and includes a metal contact. In another aspect, the device includes dielectric spacers on opposite sides of each metal gate, separating the metal gate from adjacent S/D regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of creating gate contacts in close proximity to gate-cuts in an IC device. The present disclosure addresses and solves such problems, for instance, by, inter alia, creating and utilizing temporary dielectric lines (e.g., as dummy metal lines) in the process flow of creating a gate-cut and a gate contact to a metal layer.

Figures 1A, 1B:
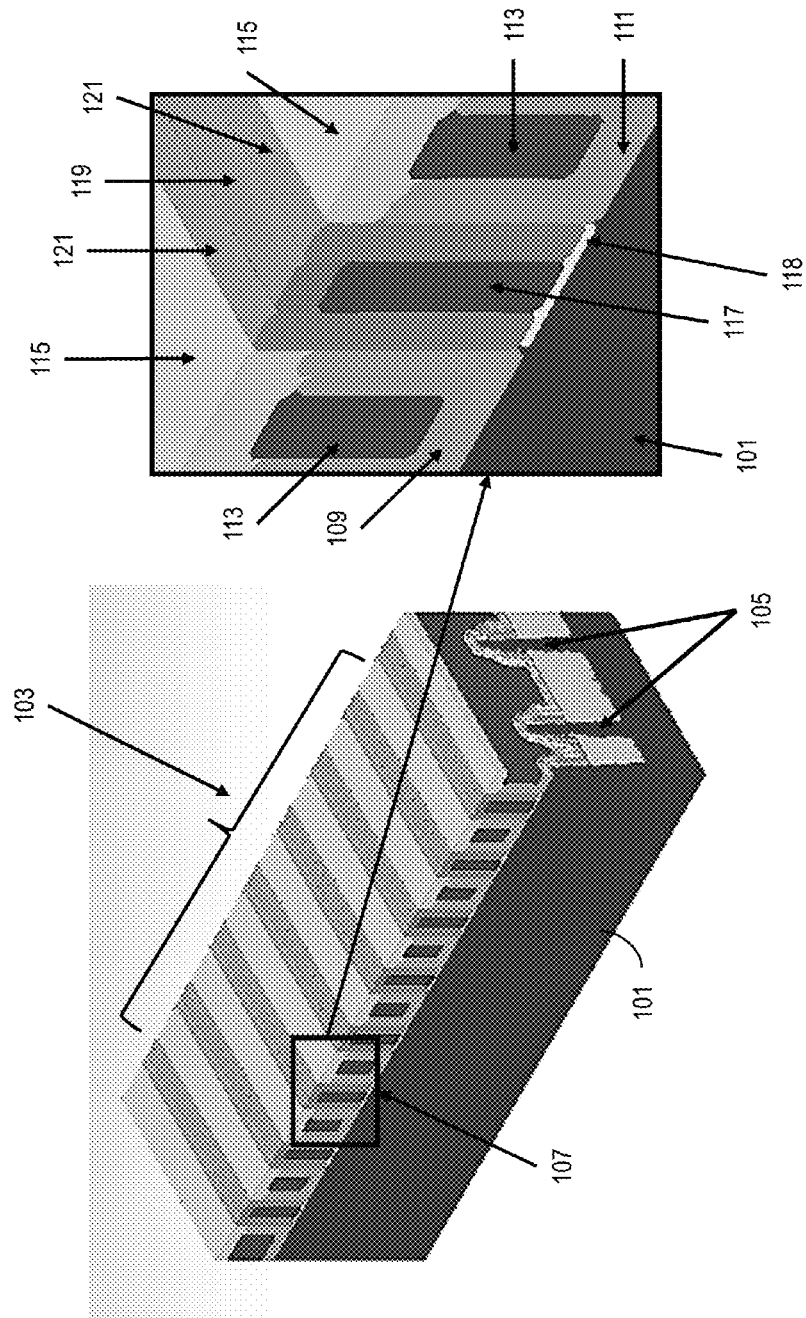
FIGS. 1A and 1B are three-dimensional diagrams of structures in an example IC device.
Figure 1C:
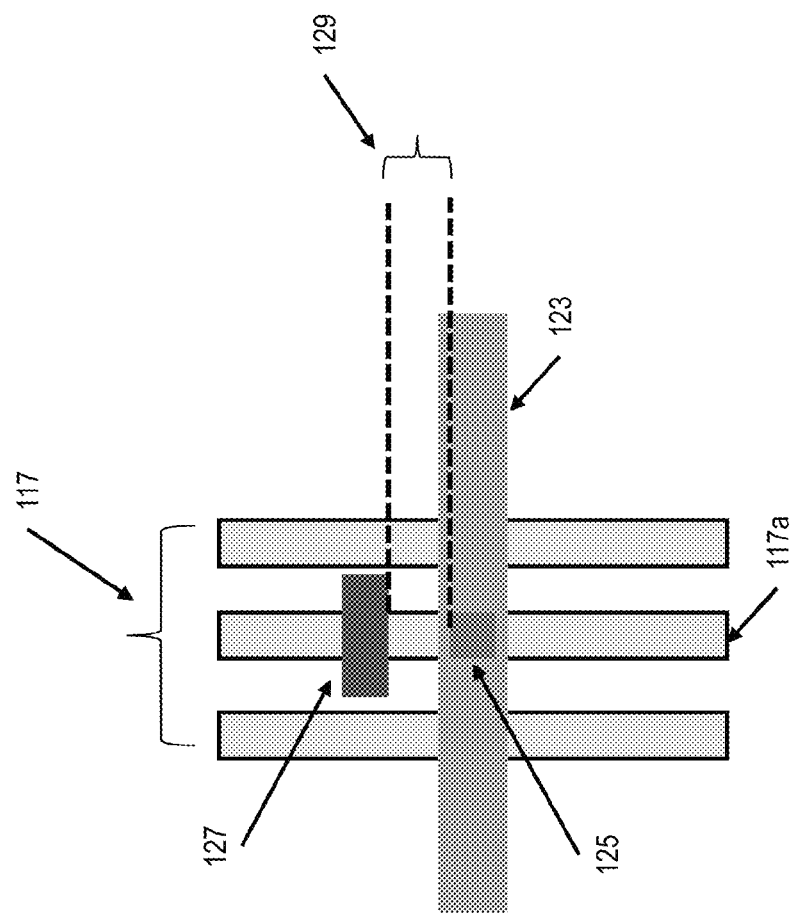
FIG. 1C illustrates a layout diagram including a gate cut and an adjacent gate contact in an example IC device.
Figure 2A:
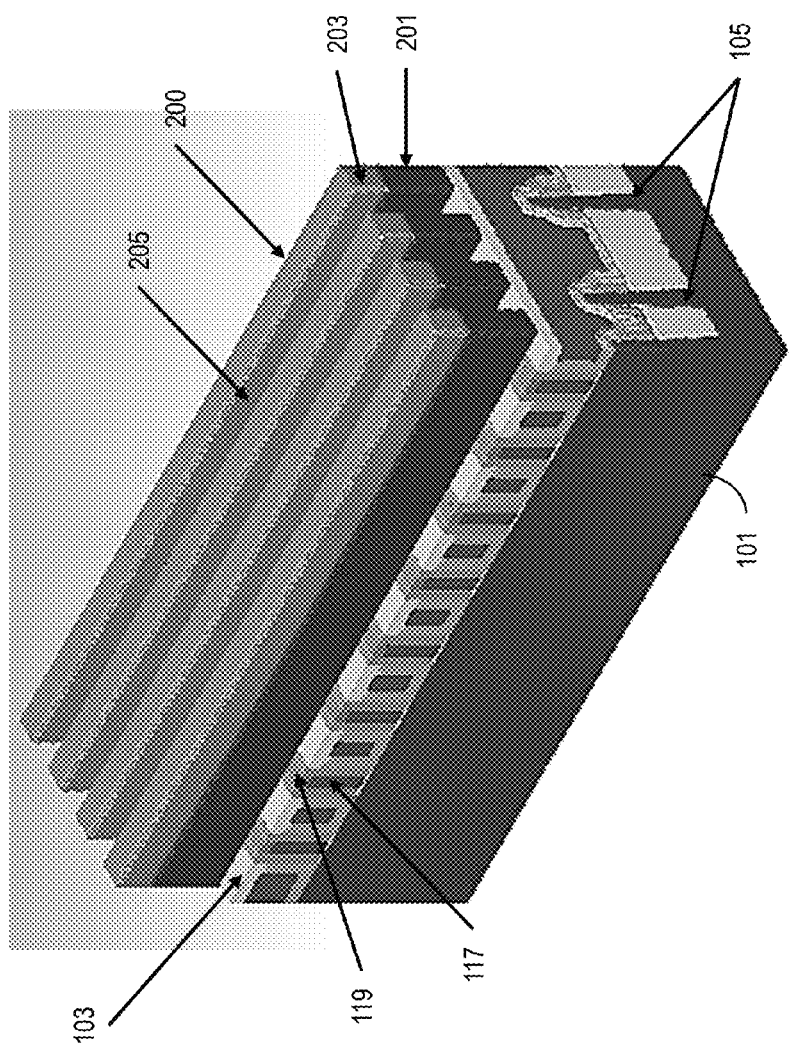
FIGS. 2A through 15B schematically illustrate a process flow for forming an IC device, in accordance with exemplary embodiments.
Figure 2B:
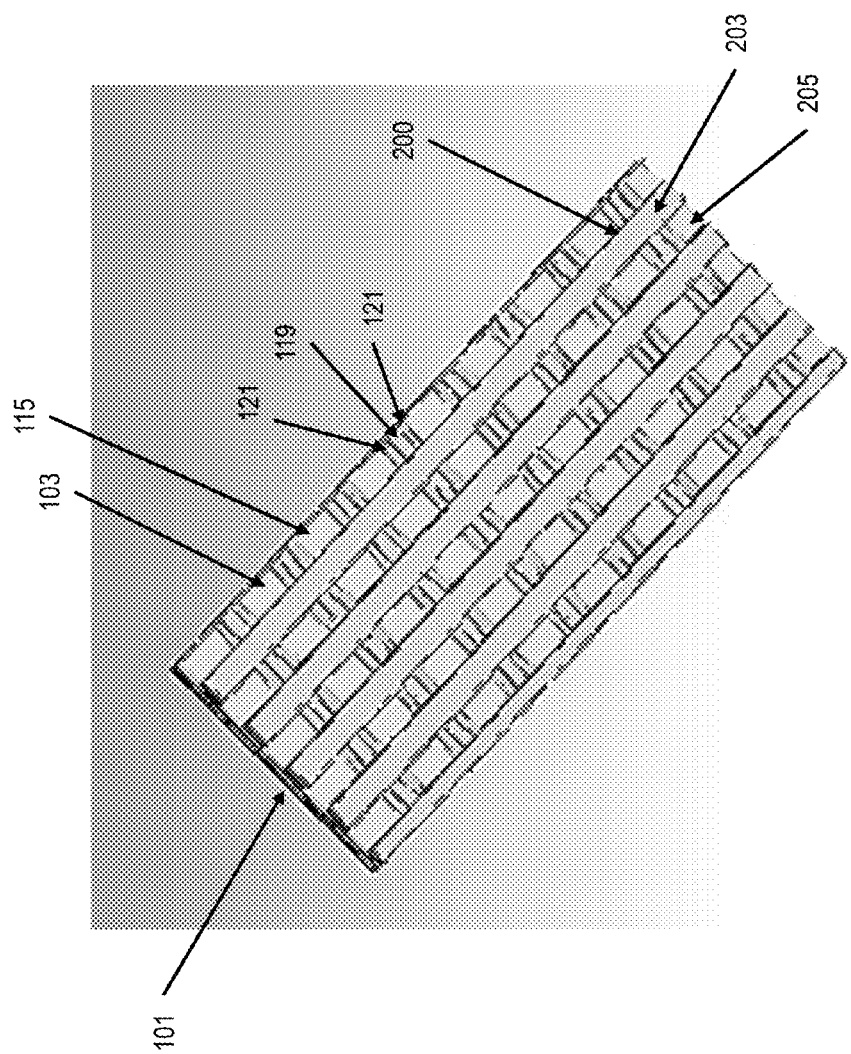

FIG. 2A illustrates a 3-D view of the Si substrate 101 and structures as discussed in relation to FIGS. 1A and 1B. Additionally, parallel dielectric lines 200 are formed on an upper surface of the structures 103, wherein the dielectric lines 200 (e.g., as dummy metal lines) are separated from each other by channels 205 and are perpendicular to and above the S/D contacts 113 and metal gate 117. The dielectric lines 200 may include an amorphous-Si (a-Si) layer 201 formed on upper surface of the structures 103 and a SiN layer 203 formed on the upper surface of the a-Si layer 201. The SiN 203 should be thicker than nitride-caps 119 over metal gates 117 so that during the gate cut etch, if any nitride 203 is exposed, enough remains over dummy metal lines 201 after the gate cut. Alternatively, the SiN layer 203 may include a silicon dioxide layer (not shown for illustrative convenience) over the SiN. Then, during the gate cut, gate-cap removal has good selectivity to the oxide (in a fluorine-based chemistry). The oxide cap would be polished away during subsequent SiOC chemical mechanical polishing (CMP). Also, the dielectric lines 200 may be formed by use of other suitable materials as the lines are placeholders and will be removed later in the process flow. FIG. 2B illustrates a top view of the device of FIG. 2A. As illustrated, between the SiN layer 203, in the separating channels 205, are nitride-caps 119, spacers 121, and oxide-caps 115. It is noted that the dielectric lines 200 may be formed by use of lithography etching, self-aligned single/multi patterning, or the like processes.

Figure 3:
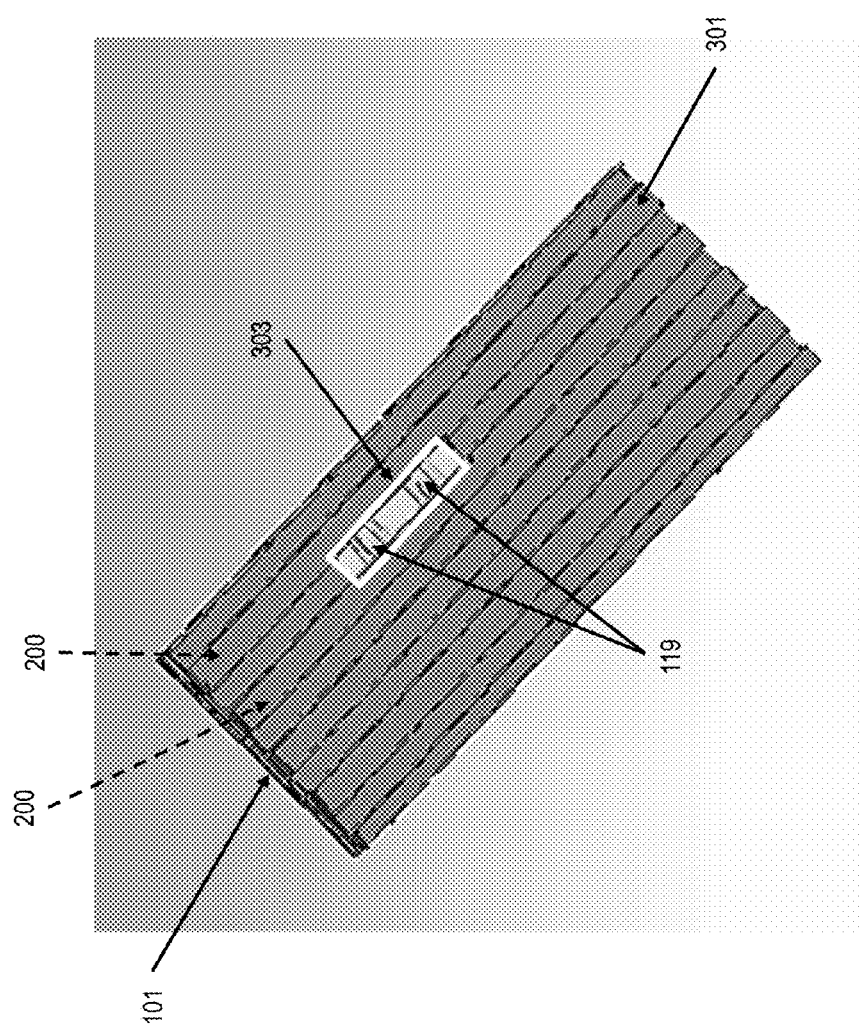
Figure 4:
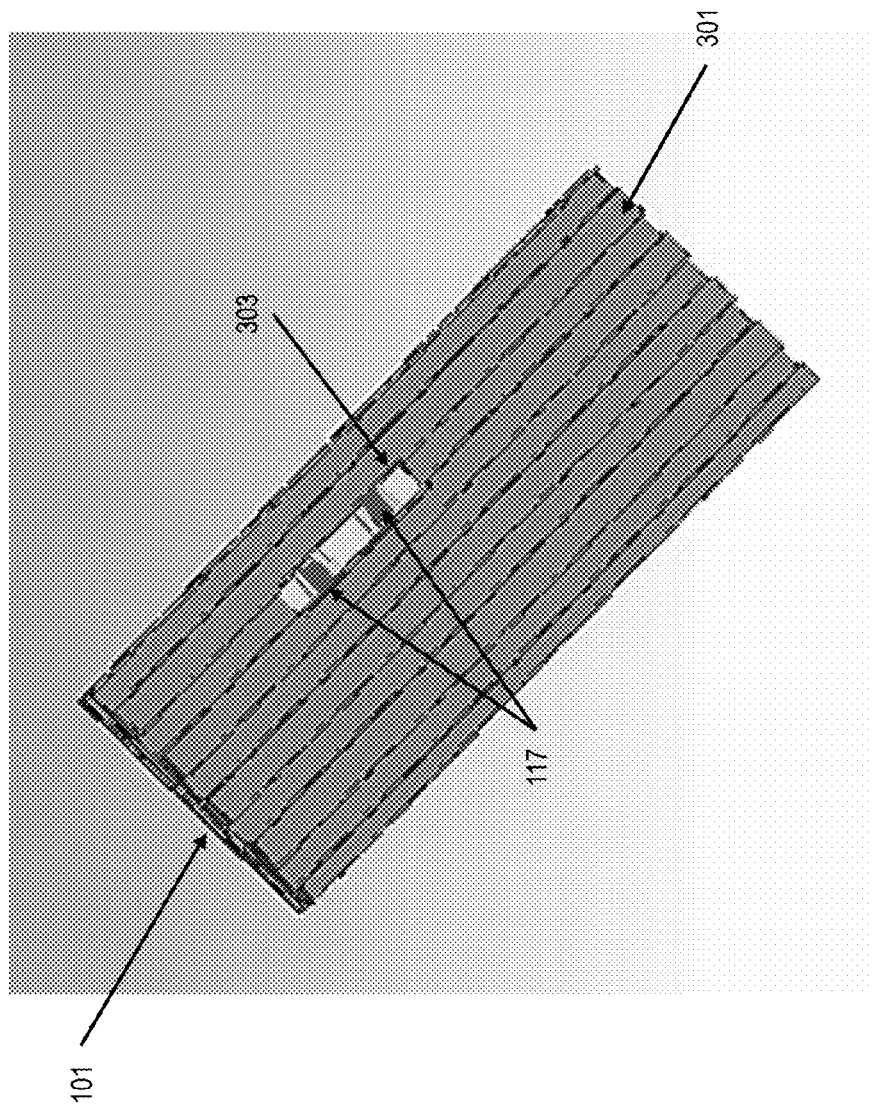
Figure 5:
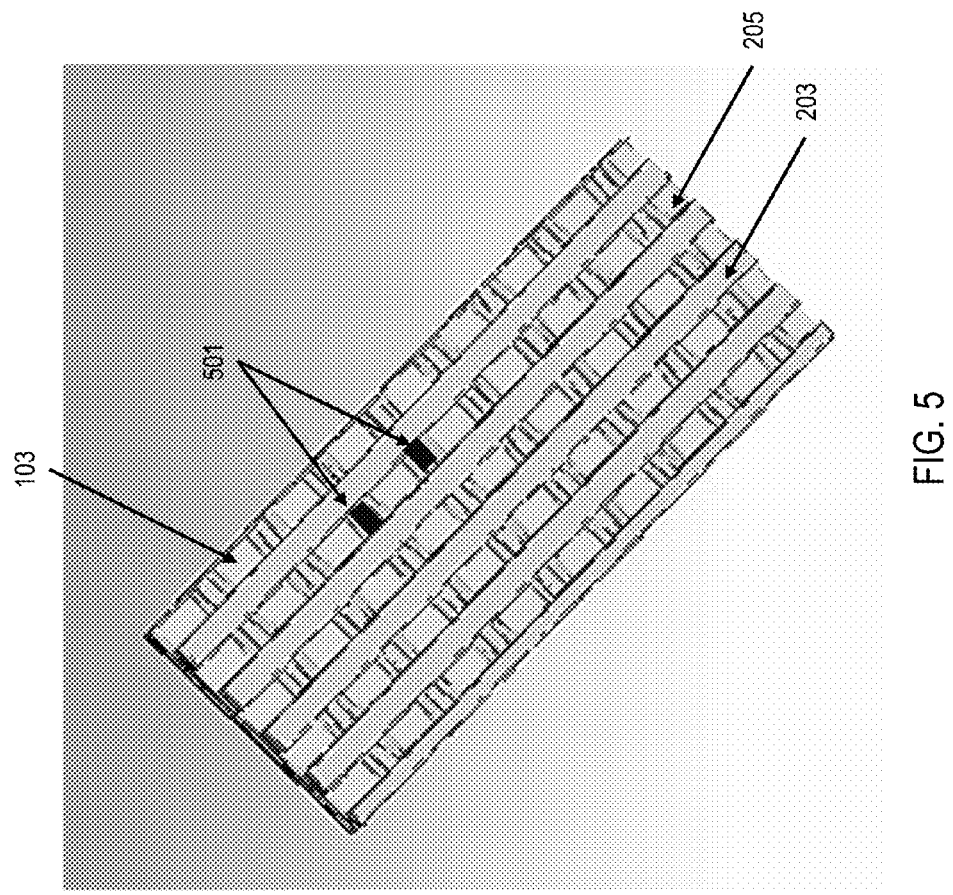

FIG. 3 illustrates an upper surface of a first photoresist 301 formed over the parallel dielectric lines 200 and in the channels 205, where an opening 303 is formed in the photoresist 301 for performing a gate-cut. It is noted that the opening 303 is over a channel 205 that separates two adjacent dielectric lines 200; however, even if the opening 303 were expanded to expose some of the upper surfaces of the two adjacent dielectric lines 200, the exposure would not pose an issue, as the dielectric lines 200 can provide a mask for a gate-cut lithography. One or more nitride-caps 119 are exposed, where each nitride-cap may be in between two adjacent Si fins (e.g., fins 105). In FIG. 4 the exposed nitride-caps 119 may be removed to expose underlying metal gates 117, and in FIG. 5, the exposed metal gates 117 and a remainder of the first photoresist layer 301 is removed to re-expose the upper surfaces of the SiN layers 203, the channels 205, the nitride-caps 119, spacers 121, and oxide-caps 115 in channels 205 and gate cavities 501 resulting from removal of the exposed metal gates 117. The nitride-caps 119 and the metal gates 117 may be removed by use of material selective chemicals in respective etching processes.

Figure 6A:
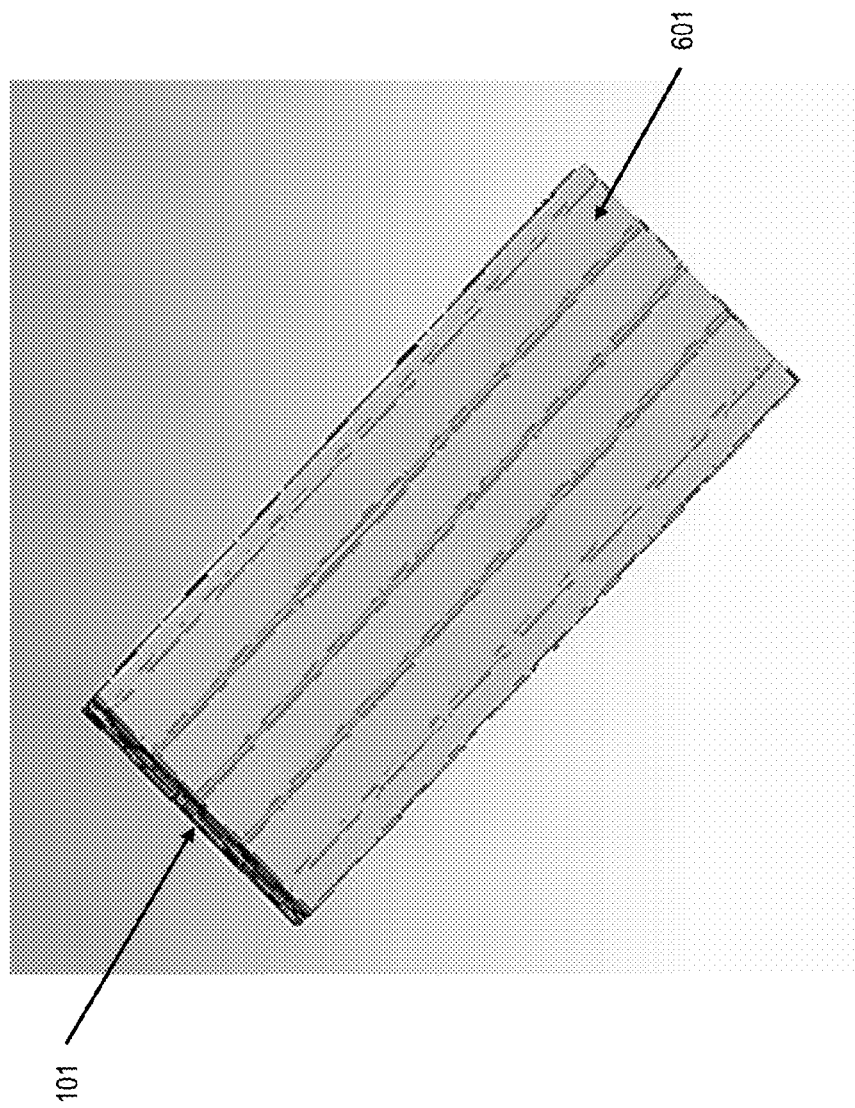
Figure 6B:
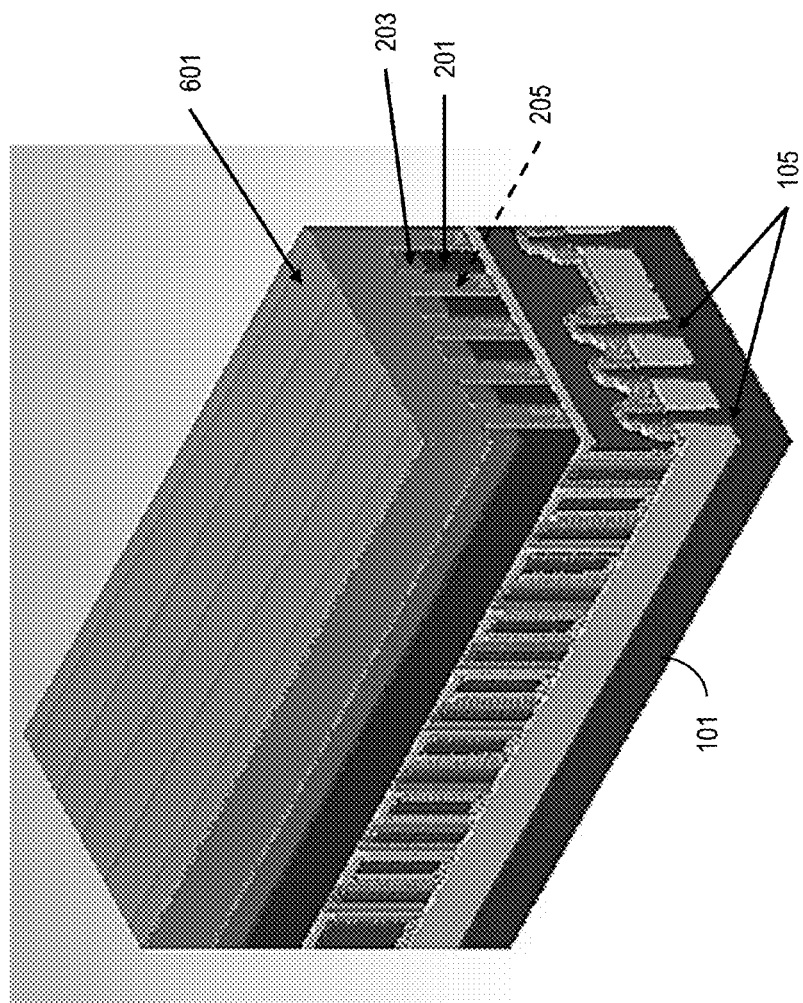
Figure 7:
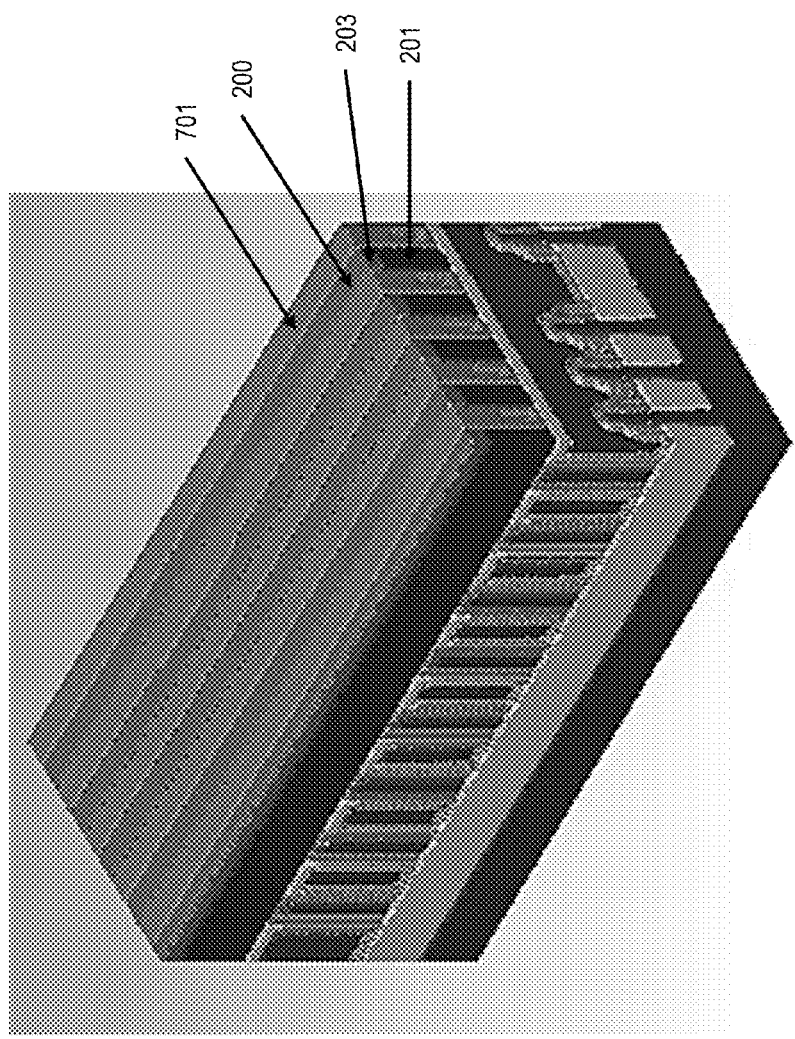

FIG. 6A illustrates forming of a low-k dielectric layer 601 (e.g., SiOC) over the upper surfaces of the SiN layers 203, in the channels 205 (previously empty), and in the gate cavities 501. FIG. 6B illustrates a 3D view of the Si substrate 101 as discussed in relation to FIG. 6A. In FIG. 7, an upper portion of the low-k dielectric layer 601 is removed, for example by a CMP process, to form low-k dielectric lines 701 adjacent to and in between the parallel dielectric lines 200. The parallel dielectric lines 200 and the low-k dielectric layer lines 701 are polished to be substantially coplanar.

Figure 8:
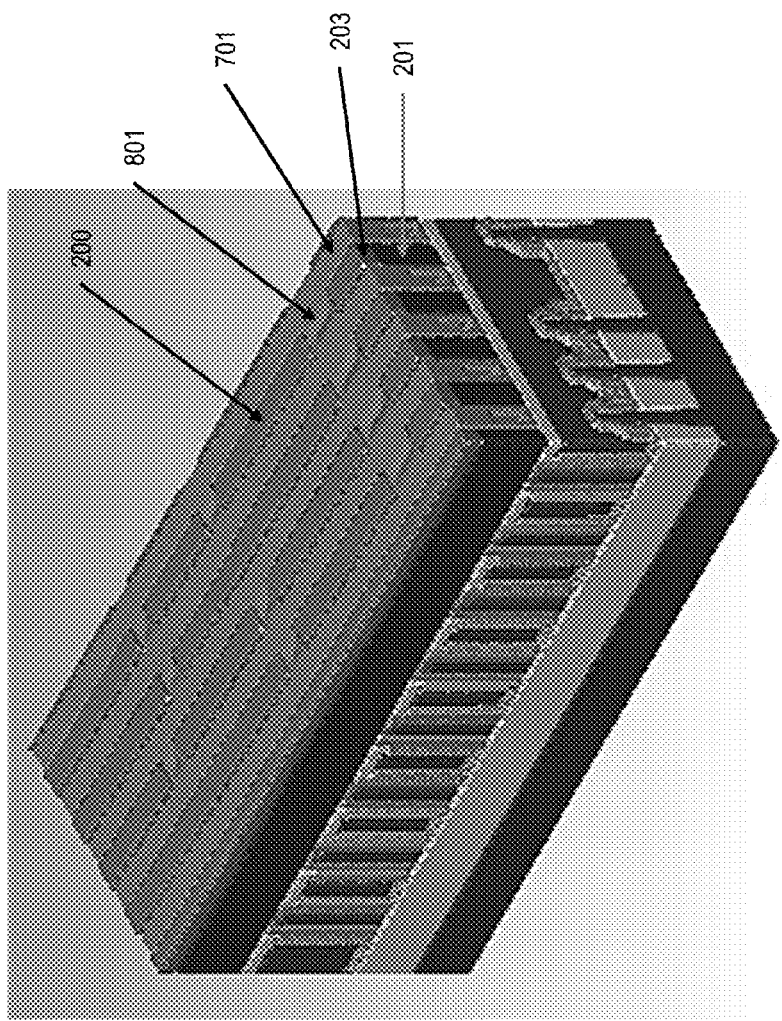
Figure 9:
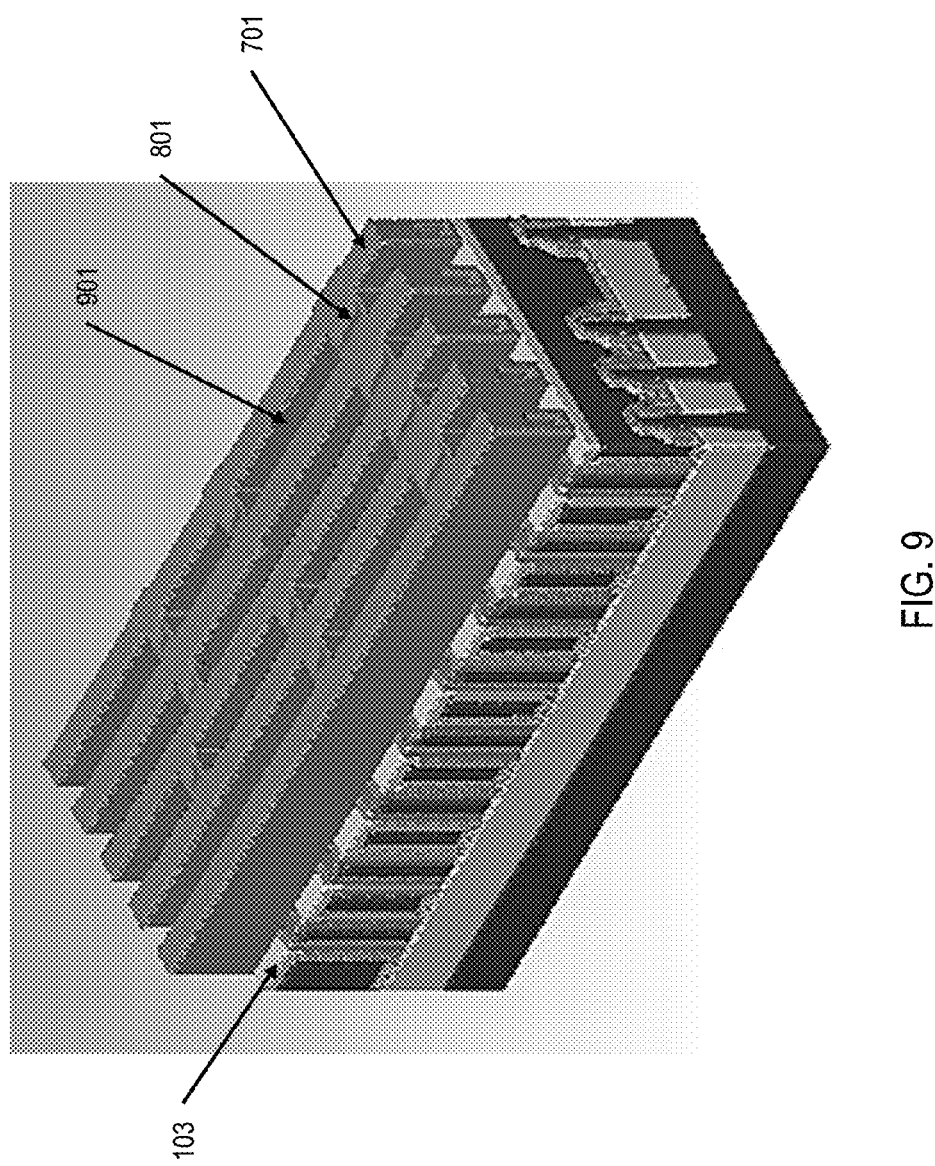
Figure 10:
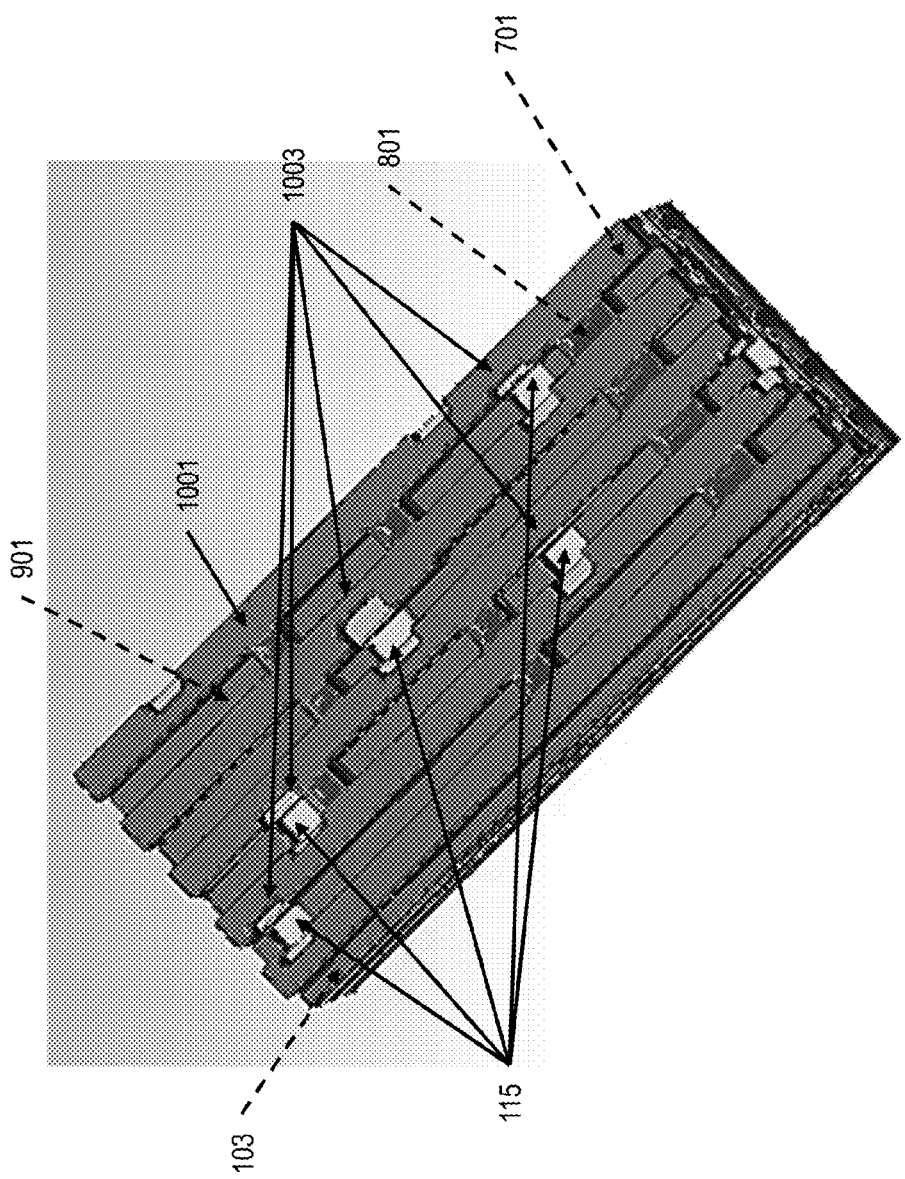

FIG. 8 illustrates additional low-k dielectric line segments 801 for providing perpendicular interconnects between some of the parallel low-k dielectric lines 701. The line segments 801 may be formed by removing sections of the parallel dielectric lines 200 and filling with the same material as low-k dielectric lines 701. FIG. 9 illustrates removing the remainder of the parallel dielectric lines 200 to form trenches 901 and exposing upper surface of structures 103. Further, in FIG. 10, a second photoresist layer 1001 is formed over the parallel low-k dielectric lines 701, the perpendicular interconnect line segments 801, and in the trenches 901. Additionally, sections 1003 of the second photoresist layer 1001 are removed to expose some of the oxide-caps 115.

Figure 11:
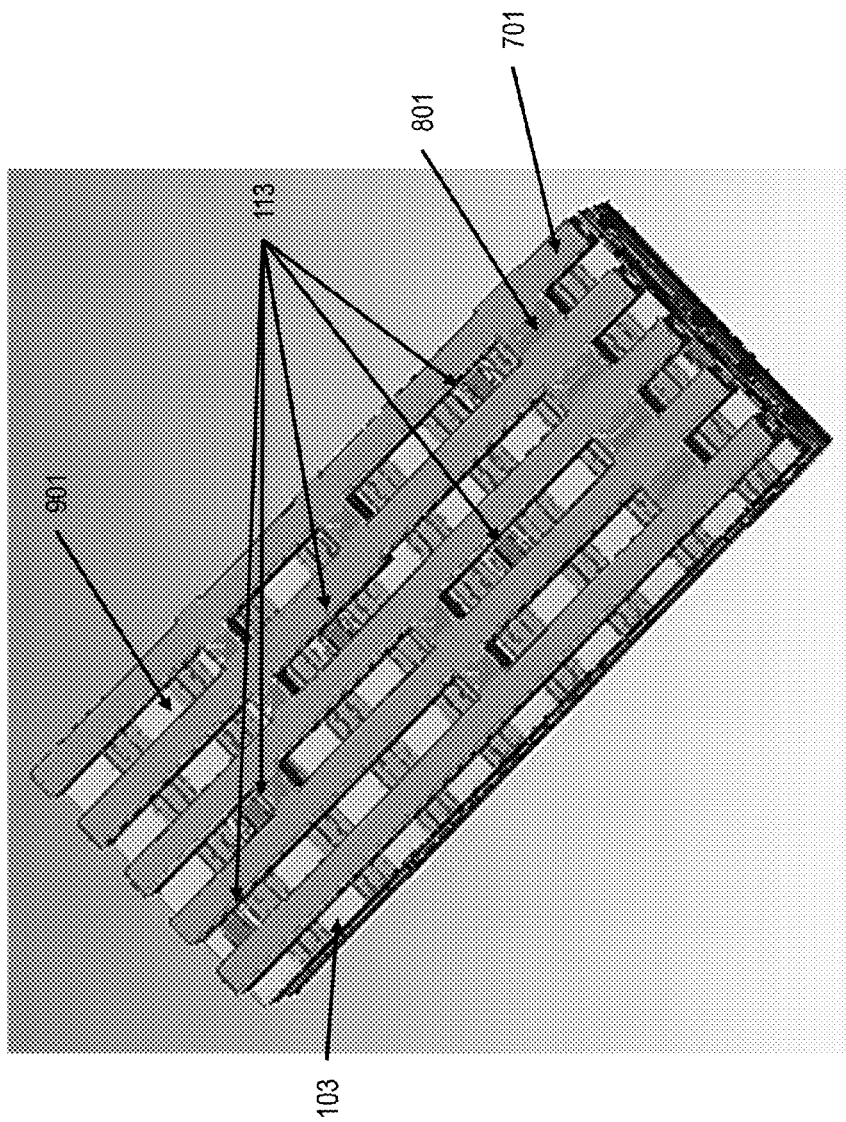
Figure 12:
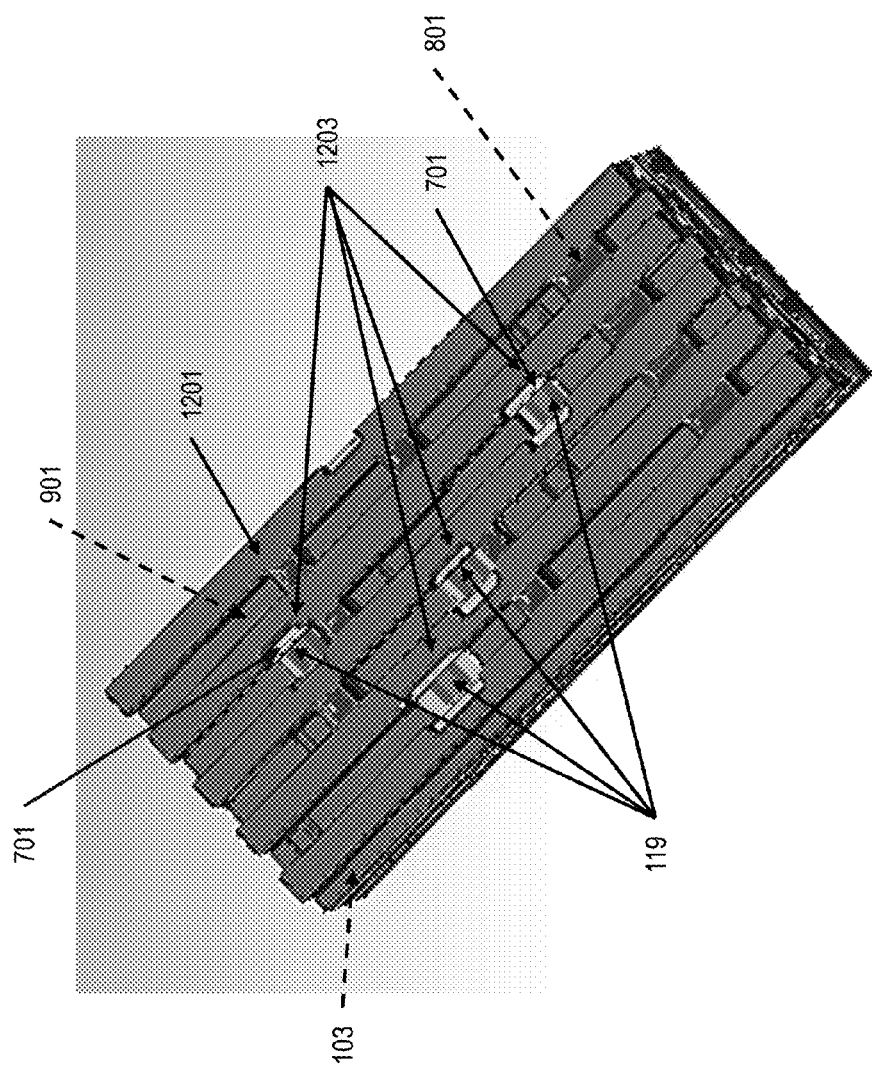
Figure 13:
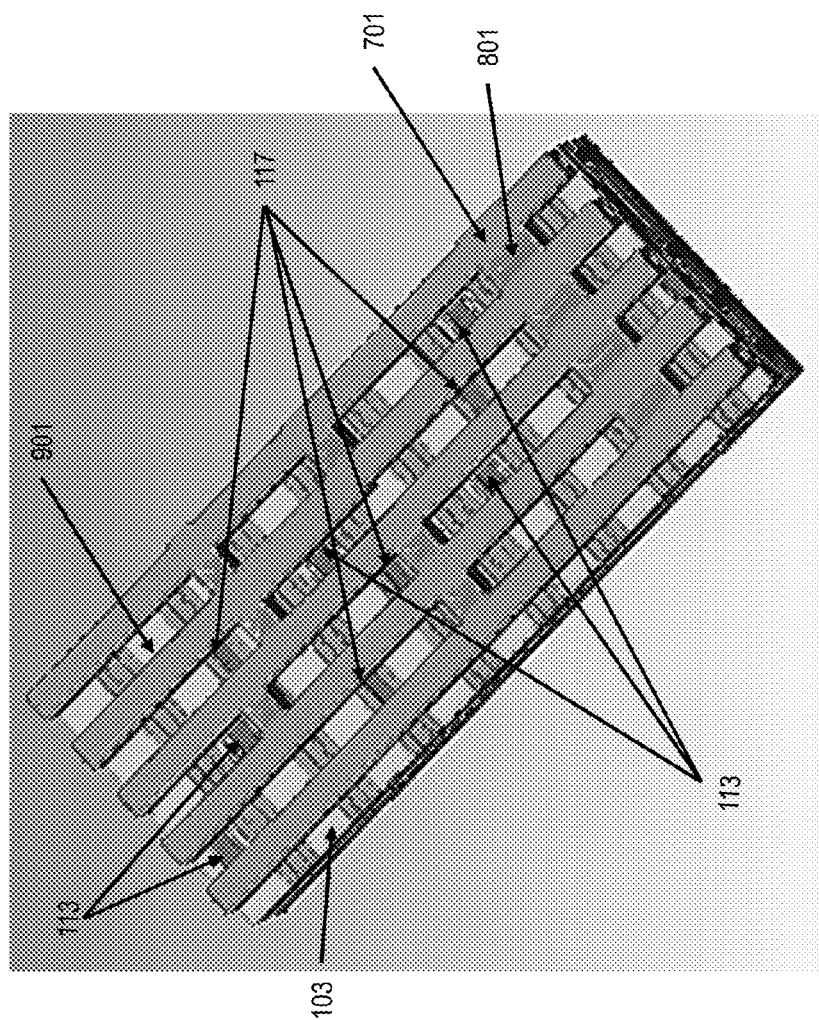

FIG. 11 illustrates removing (e.g., oxide etch of) the exposed oxide-caps 115 to create an oxide-cap cavity, exposing the S/D contacts 113. Next, a remainder of the second photoresist layer 1001 is removed to re-expose the low-k dielectric layer lines 701, the perpendicular interconnect line segments 801, and the upper surface of structures 103 in the trenches 901. FIG. 12 illustrates forming of a third photoresist layer 1201 over the parallel low-k dielectric lines 701, the perpendicular interconnects 801, and on the upper surface of structures 103 in the trenches 901. Next, sections 1203 of the third photoresist layer 1201 are removed to expose nitride-caps 119. As illustrated, the openings at sections 1203 may be slightly larger than the nitride-caps 119; however, partially exposed low-k dielectric lines 701 will act as a block mask during removal of the nitride-caps 119. In FIG. 13, the exposed nitride-caps 119 are removed to expose underlying metal gates 117 (e.g., for future contacts between the metal layer 123 and gate 117a). Next, a remainder of the third photoresist layer 1201 is removed to re-expose the low-k dielectric lines 701, the perpendicular interconnect line segments 801, and the upper surface of structures 103 in the trenches 901. In addition, the exposed S/D contacts 113 are re-exposed.

Figure 14:
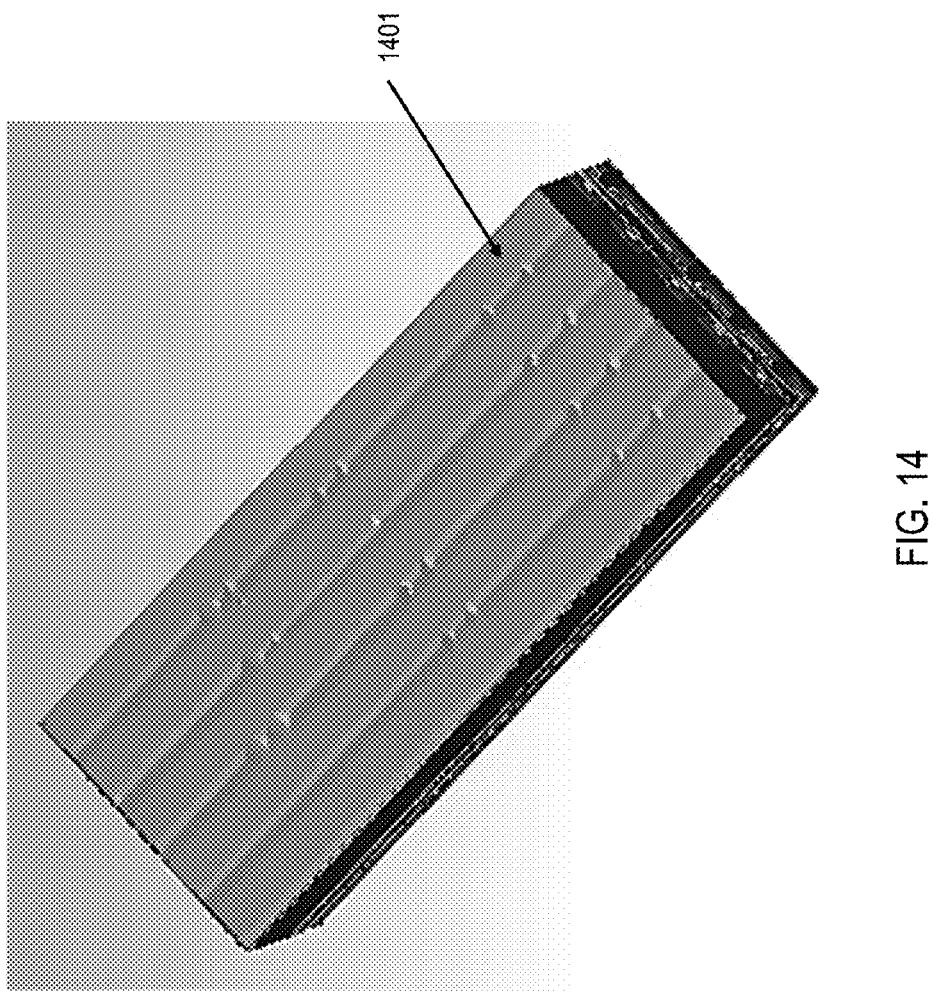
Figure 15A:
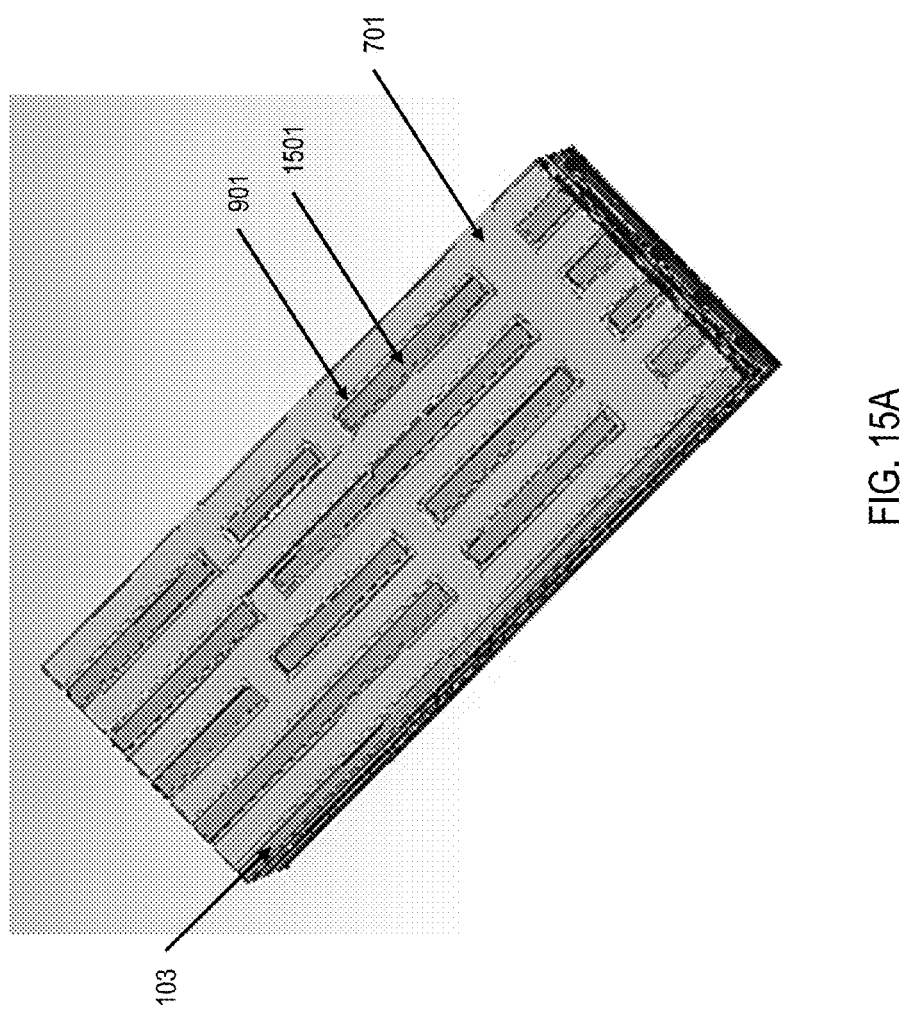
Figure 15B:
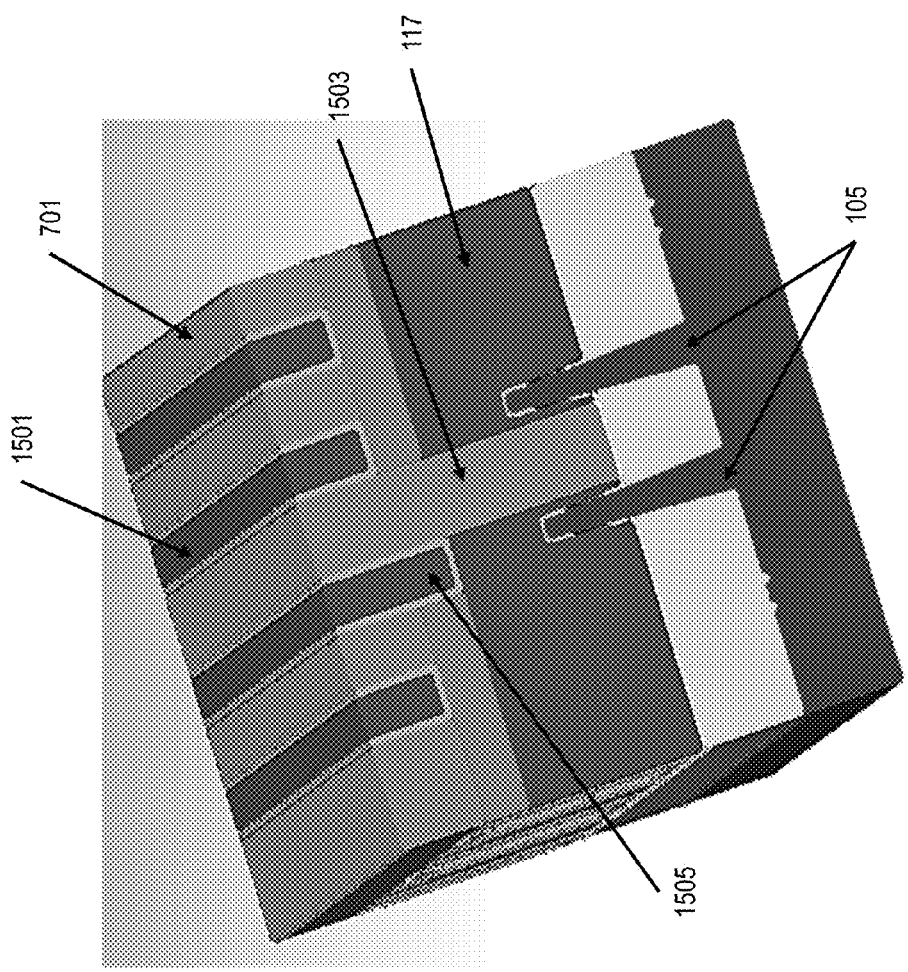

In FIG. 14, a metal layer 1401 is formed over the low-k dielectric lines 215, over the perpendicular interconnect line segments 801, in the trenches 901, in the nitride-cap cavities (e.g., in place of the nitride-caps 119) on the upper surface of the metal gates 117, and on the exposed S/D contacts 113. Further, in FIG. 15A, a portion of the metal layer 1401 is removed (e.g., by CMP) to form metal lines 1501 in the trenches 901 and on exposed sections of the upper surface of structures 103. FIG. 15B illustrates a 3D view of a gate cross-section showing the low-k dielectric lines 701 coplanar with the metal lines 1501. Also shown are gate cut 1503, which is between a pair of adjacent Si fins 105, and a metal gate contact 1505 to gate 117.

The embodiments of the present disclosure can achieve several technical effects, including fabrication of compact components in an IC device by implementing a self-aligned gate-cut to meet the constraints for creating a gate contact in close proximity to a gate-cut. Spacing is no longer needed between the gate contact and the gate cut. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, digital processors, etc.), particularly for 10 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a silicon (Si) substrate with silicon fins and at least one metal gate, each metal gate having a nitride-cap perpendicular to and over the silicon fins, with source/drain (S/D) regions on the silicon fins on opposite sides of each gate and an oxide-cap on each S/D region;
forming parallel dielectric lines separated from each other perpendicular to and over the at least one gate;
forming a first photoresist over the parallel dielectric lines and forming an opening in the photoresist to expose at least one of the nitride-caps between two silicon fins;
removing the exposed at least one nitride-cap to expose an underlying metal gate;
removing the exposed underlying metal gate and a remainder of the first photoresist layer, after removing the exposed at least one nitride cap to expose the underlying gate;
forming parallel low-k dielectric lines adjacent to and in between the parallel dielectric lines;
removing sections of the parallel dielectric lines;
forming perpendicular interconnects between the parallel low-k dielectric lines;
removing a remainder of the parallel dielectric lines forming trenches; and
forming a metal layer in the trenches.

2. The method according to claim 1, further comprising:
forming a second photoresist layer on the parallel low-k dielectric lines and the perpendicular interconnects and in the trenches prior to forming the metal layer;
removing sections of the second photoresist layer to expose oxide-caps; and
removing the exposed oxide-caps and a remainder of the second photoresist layer.

3. The method according to claim 2, further comprising:
forming a third photoresist layer on the parallel low-k dielectric lines and the perpendicular interconnects and in the trenches;
removing sections of the third photoresist layer to expose at least one of the nitride-caps;
removing the exposed at least one nitride-cap, after removing sections of the third photoresist layer to expose the at least one of the nitride caps, to form nitride-cap cavities, wherein each of the nitride-cap cavities is adjacent to a gate cavity; and
removing a remainder of the third photoresist layer.

4. The method according to claim 1, wherein forming the metal layer comprises:
forming the metal layer on the parallel low-k dielectric lines and the perpendicular interconnects and in the trenches; and
performing a chemical mechanical polishing of the metal layer to be substantially coplanar with an upper surface of the low-k dielectric lines.

5. The method according to claim 1, comprising forming each of the parallel dielectric lines by forming an amorphous Si layer on the upper surface of the Si substrate and a silicon-nitride (SiN) layer on upper surface of the amorphous Si layer.

6. The method according to claim 5, further comprising forming a silicon dioxide layer on the SiN layer of the parallel dielectric lines.

7. The method according to claim 5, wherein the SiN layer is thicker than the nitride-cap.

8. The method according to claim 1, wherein each of the S/D regions is recessed and includes a metal contact.

9. The method according to claim 1, further comprising:
forming dielectric spacers on opposite sides of each metal gate, separating each metal gate and its nitride-cap from adjacent S/D regions and oxide-caps, respectively.

10. A method comprising:
providing a substrate with silicon fins and at least one metal gate, each metal gate having a nitride-cap perpendicular to and over the silicon fins, with source/drain (S/D) regions on the fins on opposite sides of each gate and an oxide-cap on each S/D region;
forming parallel dielectric lines separated from each other perpendicular to and over the at least one gate;
forming a first photoresist over the parallel dielectric lines and forming an opening in the photoresist to expose at least one nitride-cap between two fins;
removing the exposed nitride-cap to expose an underlying metal gate;
removing the exposed metal gate and a remainder of the first photoresist layer;
forming parallel low-k dielectric lines adjacent to and in between the parallel dielectric lines;
removing sections of the parallel dielectric lines;
forming perpendicular interconnects between the parallel low-k dielectric lines;
removing a remainder of the parallel dielectric lines forming trenches;
forming a second photoresist layer on the parallel low-k dielectric lines and the perpendicular interconnects and in the trenches prior to forming the metal layer;
removing sections of the second photoresist layer to expose oxide-caps;
removing the exposed oxide-caps and a remainder of the second photoresist layer;
forming a third photoresist layer on the parallel low-k dielectric lines and the perpendicular interconnects and in the trenches;
removing sections of the third photoresist layer to expose at least one of the nitride-caps;
removing the exposed nitride-caps to form nitride-cap cavities, wherein each of the nitride-cap cavities is adjacent to a gate cavity;
removing a remainder of the third photoresist layer; and
forming a metal layer in the trenches.

11. The method according to claim 10, wherein forming the metal layer comprises:
forming the metal layer on the parallel low-k dielectric lines and the perpendicular interconnects and in the trenches; and
performing a chemical mechanical polishing of the metal layer to be substantially coplanar with an upper surface of the low-k dielectric lines.

12. The method according to claim 10, comprising forming each of the parallel dielectric lines by forming an amorphous Si layer on the upper surface of the Si substrate and a silicon-nitride (SiN) layer on upper surface of the amorphous Si layer.

13. The method according to claim 12, further comprising forming a silicon dioxide layer on the SiN layer of the parallel dielectric lines.

14. The method according to claim 10, wherein each of the S/D regions is recessed and includes a metal contact.

15. The method according to claim 10, further comprising:
forming dielectric spacers on opposite sides of each metal gate, separating the metal gate and nitride-cap from adjacent S/D regions and oxide-caps, respectively.

* * * * *